(12) United States Patent
Barron et al.

(10) Patent No.: US 7,093,158 B2
(45) Date of Patent: Aug. 15, 2006

(54) DATA REDUNDANCY IN A HOT PLUGGABLE, LARGE SYMMETRIC MULTI-PROCESSOR SYSTEM

(75) Inventors: Dwight L. Barron, Houston, TX (US); Sompong P. Olarig, Pleasonton, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 629 days.

(21) Appl. No.: 10/095,125

(22) Filed: Mar. 11, 2002

(65) Prior Publication Data

US 2003/0172330 A1    Sep. 11, 2003

(51) Int. Cl.
G06F 11/00 (2006.01)
G06F 12/00 (2006.01)
G11C 29/00 (2006.01)

(52) U.S. Cl. .......................... 714/6; 711/114; 714/763
(58) Field of Classification Search ................ 714/5–7, 714/711, 19, 49, 764, 768, 770; 711/5, 114; 709/251
See application file for complete search history.

(56) References Cited

U.S. PATENT DOCUMENTS

| | | | |
|---|---|---|---|
| 6,061,752 A | 5/2000 | Jones et al. .................. | 710/103 |
| 6,154,789 A | 11/2000 | Grieff et al. ................... | 710/14 |
| 6,161,165 A * | 12/2000 | Solomon et al. ............ | 711/114 |
| 6,161,192 A | 12/2000 | Lubbers et al. ................ | 714/6 |
| 6,269,453 B1 * | 7/2001 | Krantz .......................... | 714/6 |
| 2002/0084908 A1 * | 7/2002 | Los et al. .............. | 340/815.45 |
| 2002/0124114 A1 * | 9/2002 | Bottom et al. .............. | 709/251 |

* cited by examiner

*Primary Examiner*—Guy Lamarre
*Assistant Examiner*—John J. Tabone, Jr.

(57) ABSTRACT

A computer system includes a plurality of field replaceable units, each having volatile memory and at least one CPU. The FRUs communicate with each other via centralized logic. A RAID data fault tolerance technique is applied to the system so that an FRU can be lost or removed without loss of its data. An exclusive OR engine is included in the centralized logic or distributed among the FRUs. The RAID logic can restripe itself upon removal or addition of a FRU.

20 Claims, 2 Drawing Sheets

DATA REDUNDANCY IN A HOT PLUGGABLE, LARGE SYMMETRIC MULTI-PROCESSOR SYSTEM

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to providing redundancy for volatile memory. More particularly, the invention relates to applying "RAID" techniques to a plurality of replaceable processing units having integrated volatile memory.

2. Background of the Invention

As is commonly known, a computer typically includes at least one central processing unit ("CPU"), random access memory, mass storage, input/output devices and numerous other components. Such components are coupled together through one or more digital connections called "busses."

To improve system performance, one trend has seen the integration of memory controllers, memory and a CPU on a "processing" module. Such modules typically have a connector which enables the module to be plugged into a computer system's main system board. Such computer systems, in fact, may be able to accommodate multiple processing modules. In a system with multiple processing modules, the CPU of one module can access its own memory or the memory of another module. This type of architecture permits computer systems to be scalable so as to increase the number of CPUs and memory.

Another trend in the computer arts has been to make various components "hot pluggable." A hot pluggable component is one that can be installed into a system that is already powered up and running. This type of component installation is in contrast to non-hot pluggable components which can only be installed into a system that is first powered off, and then powered on after the component has been installed. Typically, hot pluggable components can also be hot removable meaning they can be removed from a system without first powering off the system. Such hot pluggable-based systems include a mechanism to detect when a component has been removed or installed.

The trend towards hot pluggable components has created a desire to be able to hot remove and install processing modules as described above. However, because such modules include RAM memory which is volatile, meaning that the contents of the memory are lost once power is turned off to the memory device, a decision must be made by the system designer as to what should happen to the data that is stored on a processing module when it is removed and replaced. When the processing module is removed, power is lost to the module of course and the data contained on the volatile memory in the module effectively is erased. One approach might be simply to live without the data and the degradation that may be caused by the loss of the data. This approach may be simple to implement, but the loss of data may not be desirable in many applications, particularly for mission critical applications.

Accordingly, it would be desirable to be able to retain the data on a processing module that is removed from a computer system so that, upon replacement with a new module, the new module can be loaded with the data from the old module. Despite the advantages such a system would provide, to date no such system is known to exist.

BRIEF SUMMARY OF THE PREFERRED EMBODIMENTS OF THE INVENTION

The problems noted above are solved in large part by applying a RAID redundancy technique to a computer system comprising a plurality of field replaceable units ("FRUs"). A FRU includes one or more CPUs coupled to volatile random access memory ("RAM"). The plurality of FRUs communicate with each other via a centralized logic unit such as a switch. In accordance with the preferred embodiment of the invention, the system implements the RAID-5 technique in which RAID sets are created. For each RAID set, a parity value is maintained. The parity values are distributed across all of the FRUs. With this configuration, if one FRU fails or is removed, the data on that FRU can be recalculated from the data and parity of the remaining FRUs.

The parity value for a RAID set is created by exclusive OR'ing all of the data in the RAID set which is distributed across multiple FRUs. An exclusive OR engine is included in the system to perform this function. In one embodiment, a single exclusive OR engine can be included in the centralized logic. Alternatively, individual exclusive OR engines can be included in each of the FRUs.

If an FRU is removed from the system (or fails), the remaining FRUs can be "restriped." This means that parity is recalculated for a system having one fewer FRUs. This advantageously permits the system still to be fault tolerant even though an FRU is taken out of operation. If an FRU is added, the system can be restriped in light of the increased number of FRUs.

These and other advantages will become apparent upon reviewing the following disclosures.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples"

is intended to mean either a direct or indirect electrical connection. Thus, if a first device couples to a second device, that connection may be through a direct electrical connection, or through an indirect electrical connection via other devices and connections. In addition, no distinction is made between a "processor," "microprocessor," "microcontroller," or "central processing unit" ("CPU") for purposes of this disclosure. To the extent that any term is not specially defined in this specification, the intent is that the term is to be given its plain and ordinary meaning.

DETAILED DESCRIPTION OF THE PREFERRED EMBODIMENTS

Figure 1:
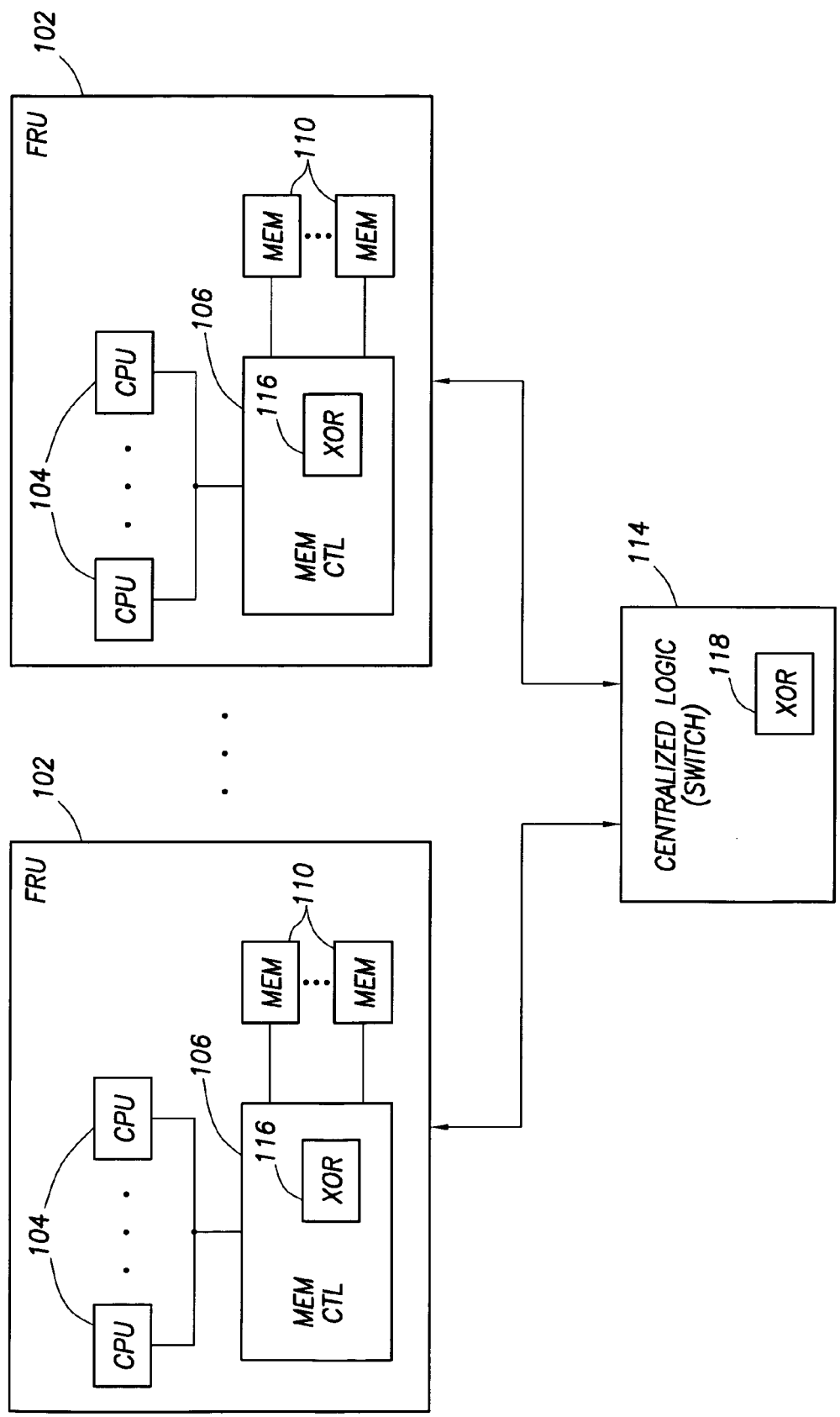
FIG. 1 shows a computer system having a plurality of field replaceable processor/memory units and embodying the preferred embodiment of the invention implementing a RAID-type fault tolerant scheme for the memory.

Referring to FIG. 1, a computer system 100 is shown constructed in accordance with the preferred embodiment of the invention. As shown, system 100 includes two or more field replaceable units ("FRUs") 102. An FRU includes at least one CPU 104 and volatile memory 110. As shown in the embodiment of FIG. 1, each FRU 102 also includes a memory controller 106 coupled to the CPUs 104. The memory controller 106, in turn, couples to two or more memory devices 110. This architecture permits the CPUs 104 to be able to read from and write to the memory 110 through the memory controller 106. Other components may be included in the FRU 102, but have been omitted for sake of clarity.

Each FRU 102 is replaceable meaning that it can be removed from the computer system 100 and a new FRU can be installed in its place. Further still, each FRU 102 preferably is hot pluggable so that the FRUs can be removed and replaced while the computer system 100 is powered on and running. If an extra slot exists, an FRU can be added to the system (i.e., not merely a replacement). Any suitable technique for detecting a hot plug event and responding accordingly can be used in conjunction with the embodiment of FIG. 1. Suitable examples are disclosed in U.S. Pat. Nos. 6,269,453, 6,161,192, 6,154,789 and 6,061,752, all of which are incorporated herein by reference.

Each FRU 102 preferably couples to a centralized logic unit 114, which may be a switch. At least one function performed by switch 114 is to permit each FRU 102 to communicate with other FRUs. Such communications can be for the purpose of transferring data between FRUs. Accordingly, an FRU can access its own memory as well as the memory of other FRUs. Another function that may be performed by switch 114 is cache coherency, which is a well-known function. Genrally, cache coherency is implemented in a system in which more than one CPU may need the same data. Cache coherency facilitates keeping track of the location of each piece of data and, in certain situations, restricting the rights of multiple CPUs having the same data value to change the data.

Because the FRUs 102 preferably are hot removable and hot replaceable, a fault tolerance scheme is implemented so that the loss of a FRU will not necessarily result in the loss of the data contained therein. A FRU 102 may be lost due to a malfunction of the FRU or simply that an operator wishes to remove the FRU (for any reason) and possibly replace it with another FRU. In accordance with the preferred embodiment of the invention, the fault tolerance scheme implemented is in accordance with the Redundant Array of Independent Disks ("RAID") technique. RAID has previously been applied to hard drives (non-volatile storage) by allocating a portion of the storage capacity of an array of disk drives for parity information. In one variation of RAID, a plurality of disk drives are designated for storing data and an additional drive is allocated for storing the parity information. RAID sets or "stripes" (sometimes called "strips") are formed in which each stripe contains a portion of the data in a set which is distributed across the drives. The parity information for each set is calculated based on the corresponding data from the other drives in the array set. More specifically, the parity values are calculated by performing the exclusive OR logic function on the data in the stripe. A feature of the exclusive OR function is that, if one of the data drives is lost (e.g., fails) or removed, its contents can be recalculated by exclusive OR'ing the data from the remaining data drives along with the parity information.

There are various types and implementations of RAID techniques, but preferably the RAID-5 technique is implemented in the embodiment shown in FIG. 1. In conventional RAID-5, the parity information is distributed among the various data drives and there is no dedicated parity drive per se. In the preferred embodiment of FIG. 1, each FRU 102 is a member of a RAID-5 redundancy scheme and each FRU may be used to store parity information. As such, RAID-5 is implemented to provide redundancy to volatile memory in a multi-FRU environment in a loosely coupled architecture.

To implement RAID-5 in the system 100 of FIG. 1, an exclusive OR engine is included. The function of an exclusive OR engine is to calculate and update the parity information for each stripe. FIG. 1 illustrates two implementations of an exclusive OR engine. In one implementation, an exclusive OR engine 118 is centrally located in the switch 114. In an alternative implementation, multiple exclusive OR engines 116 are distributed among the various FRUs 102 and, more specifically, included in the FRUs' memory controllers 106. Accordingly, the exclusive OR engine can be centrally located or distributed among the FRUs.

When a CPU 104 in an FRU wishes to write data to its memory 110 (or, for that matter, memory in another FRU), preferably two actions occur—(1) the data is written to the appropriate memory location and (2) the parity information for the stripe corresponding to the newly written data is updated. Assuming the XOR engine 118 is centrally located (e.g., in centralized logic 114), the XOR engine preferably calculates in accordance with known techniques where the parity information related to the write is located, reads that parity information, exclusive ORs the existing parity information with the new data and writes back the updated parity information to its original location. As one of ordinary skill in the art would understand, the XOR engine 118 can calculate the location of the parity information based on the number of the FRUs in the system, the size in each stripe (which is configurable) and the distribution pattern for the parity information across the stripes. A RAID memory manager/mapper (not specifically shown) may be included as part of the global XOR engine 118 or as separate logic within the centralized switch 114. The RAID memory manager/mapper would preferably be used as a directory to keep track of which processor modules contain which logical blocks of system memory that are distributed across multiple modules.

In the case in which the XOR engine functionality is distributed among the FRUs 102 as XOR engines 116, each engine functions must the same way as described above. The main difference is that once a FRU receives a write request to write data to its memory, that FRU performs the write, calculates the location of the associated parity value and forwards a request to the FRU that contains the parity value. In this case, the algorithm for how to calculate the location of the parity value is stored in or otherwise accessible to each FRU. The message also includes the data being written.

The FRU that receives the parity message retrieves the existing parity value, exclusive ORs that value with the new data and writes back the newly computed parity value.

In accordance with the preferred embodiment of the invention, any cache memories (not specifically shown) located within an FRU 102 are operated according to a write-through policy or disabled. A write-through policy entails any memory writes to write the data to the cache as well as write the data through to the memory 110 with updates occurring to the corresponding parity information. Maintaining memory 110 up to date permits a FRU to be replaced without loss of data. Alternatively, the cache capabilities of the FRUs can be disabled. Preferably, the data redundancy feature of the preferred embodiment is selectable via software or other mechanism. That is, a user can enable or disable the redundancy feature. If disabled, any cache mode can be employed. If the data redundancy is enabled, the cache mode may be either set to write-through or disabled as desired.

Figure 2:
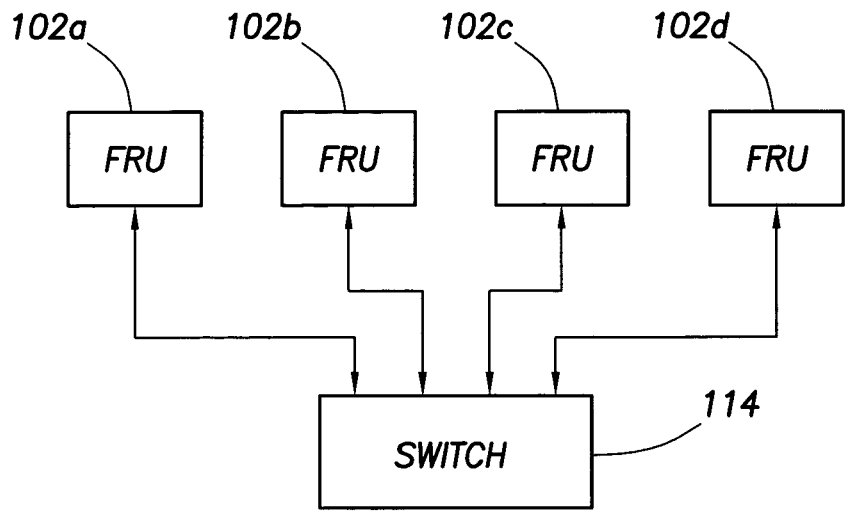
FIG. 2 depicts a system having four field replaceable units.

The advantage to applying RAID-5 to the multi-FRU architecture is that one of the FRUs 102 can fail and/or be removed and the data contained therein can be recalculated using the data on the other FRUs. Referring to FIG. 2 a multi-FRU system is shown as having four FRUs 102a–102d interconnected by a switch 114. With the preferred embodiment described herein, any one of the FRUs can fail or be removed without loss of data. For example, if FRU 102a is removed, its data could be calculated based on the data stored in FRUs 102b, 102c, and 102d. When a new FRU is inserted into the slot previously occupied by FRU 102a, the switch 114 detects the presence of the new FRU, by sensing, for example, a signal that changes state upon insertion of the new FRU. If the XOR engine 118 is centrally located in the switch 114, the switch coordinates the recalculation of the data for the newly inserted FRU. The data recalculation is accomplished one stripe at a time by reading the data for each stripe from the remaining three FRUs (102b–102d), exclusive OR'ing that data and writing the result to the newly inserted FRU 102a. If the exclusive OR engines 116 are distributed among the various FRUs, one of the FRUs can be selected to be the FRU that recalculates the data for the new FRU 102a. That selection can be made by the switch 114 or in accordance with any other suitable technique. The FRU that recalculates the data for newly installed FRU 102a reads the data for each stripe from itself and the other two FRUS (e.g., FRUs 102c and 102d in the case where FRU 102b is selected to recalculate the data) through the switch 114, exclusive ORs such data and writes the resulting data values through the switch to the new FRU 102a.

A benefit of the preferred FRU-based RAID technique described herein, relative to convention disk drive-based RAID techniques, is that upon loss of a FRU, the remaining FRUs can be "restriped" for fewer FRUs. This means that, as long as there are at least two FRUs remaining in the system, the RAID stripe sets and parity can be recalculated for the reduced number of available FRUs. Accordingly, a four FRU RAID system effectively can be converted into a three FRU RAID system. Restriping the FRUs advantageously permits the system to maintain fault tolerance.

Because the memory in the FRUs being used to store the data and the parity information comprises solid state volatile memory (e.g., random access memory), restriping the remaining FRUs can occur very quickly (i.e., on the order of seconds). By contrast, because disk drive accesses occur much slower than memory accesses, restriping disk drives might take many times as long as restriping memory. For this reason, and perhaps others, disk drives are generally not restriped upon removal of a drive.

Figure 3:
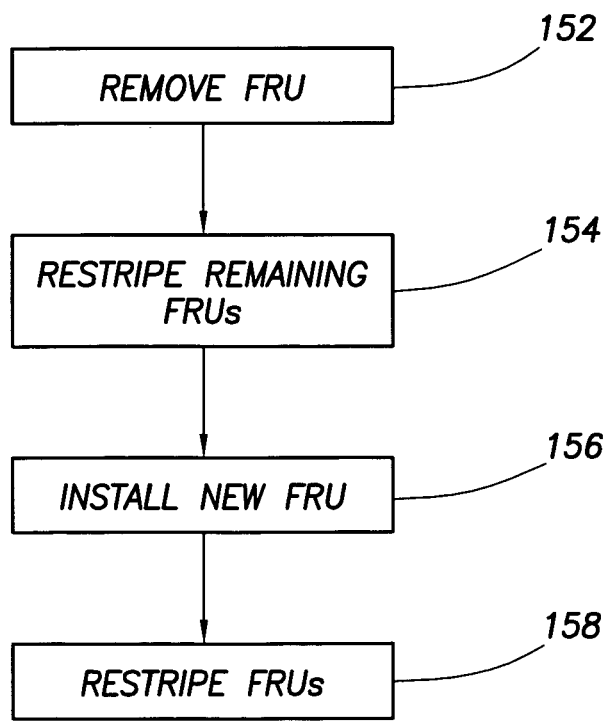
FIG. 3 is a flowchart illustrating how the system can still be fault tolerant upon loss of a field replaceable unit by restriping the remaining units.

This restriping process is illustrated in FIG. 3. In step 152, an FRU (e.g., FRU 102a) is removed from the system. Then, in step 154, the remaining FRUs are restriped. This process generally includes recalculating the data from the removed FRU, selecting a different stripe set size, storing that recalculated data on the remaining FRUs, and recalculating the parity information based on different stripe set sizes. As should be apparent to those of ordinary skill in the art, this process generally requires there to sufficient excess storage capacity in the remaining FRU memory 110 to accommodate the recalculated data from the removed FRU.

A new FRU may be installed in the system in step 156 and the system again restriped in step 158 in light of the increased number of FRUs. Some of the data from the previous FRUs can be moved over to the new FRU. Alternatively, the data can remain in place and the new FRU is simply available for any new data to be written to memory. In either case, the new FRU is made available for storing parity data and the size of the each RAID stripe is reset in light of the increased number of FRUs.

Referring still to FIG. 3, it should be understood that the FRUs can be restriped upon removal or loss of an FRU regardless of whether a new FRU is installed. Similarly, a user may desire simply to add an additional FRU to a system (i.e., not a replacement for a failed FRU), and the system can be restriped. In other words, the FRU removal step 152 and restriping process of step 154 can occur without steps 156 and 158 subsequently happening, and by the same token, steps 156 and 158 can occur even if steps 152 and 154 did not previously occur.

In addition to, or instead of, the restriping process explained above, other actions can occur when the number of operable FRUs changes (e.g., due to a failure of one FRU, etc.). For example, during the period of time while RAID redundancy is unavailable (e.g., before the FRUs can be re-striped), any read cycles to the non-operational FRU memory can be accomplished by the remaining FRUs and the exclusive OR engine(s) calculating the requested read data. That is, the remaining FRUs can supply the data from the target stripe and such data can be XOR'd together to compute the requested read data.

For write cycles to a missing or non-functional FRU, the new write data preferably is exclusive OR'd with the data in the other FRUs corresponding to the target strip to obtain a new parity value. The new write data, however, preferably is not written to memory because, of course, the target FRU is missing or non-functional. The write data is not lost, however, because it can be recalculated if need be from the members of the stripe set including the parity value.

The above discussion is meant to be illustrative of the principles and various embodiments of the present invention. Numerous variations and modifications will become apparent to those skilled in the art once the above disclosure is fully appreciated. For example, RALD techniques besides RAID-5 can be implemented as desired. It is intended that the following claims be interpreted to embrace all such variations and modifications.

What is claimed is:

1. A system, comprising:
   three or more volatile memory devices;
   wherein data is striped across said three or more volatile memory devices to provide data redundancy; and wherein, upon cessation of operation of a volatile memory device, said data is re-striped across the remaining volatile memory devices to continue to provide data redundancy.

2. The system of claim 1 wherein said data is striped across said three or more volatile memory devices in a first redundant array of independent disk (RAID) configuration and wherein, upon cessation of operation of the volatile memory device, said data is re-striped across the remaining volatile memory devices in a second RAID configuration.

3. The system of claim 1 wherein, upon installation of an additional volatile memory device in said system, said data is again re-striped across said volatile memory devices including said additional volatile memory device.

4. The system of claim 1 comprising a plurality of field replaceable units (FRUs), each FRU comprises at least one of said three or more volatile memory devices and an exclusive-OR engine, and each FRU is removable from said system independent from another FRU.

5. The system of claim 1 further comprising logic coupled to said three or more memory devices, and while said data is re-striped across the remaining volatile memory devices, said logic responds to a write request containing write data by computing an exclusive-OR operation on said write data and other data in said remaining volatile memory devices.

6. The system of claim 1 further comprising logic coupled to said three or more memory devices, and while said data is re-striped across the remaining volatile memory devices, said logic responds to a write request by computing an exclusive-OR operation on data associated with the requested read.

7. A system, comprising:
a plurality of volatile memory devices;
wherein data is striped across said plurality of volatile memory devices to provided data redundancy; and
wherein, upon an addition of a volatile memory device to said system, said data is re-striped across the volatile memory devices, including the newly added volatile memory device, to continue to provide data redundancy.

8. The system of claim 7 wherein said data is striped across said plurality of volatile memory devices in a first redundant array of independent disk (RAID) configuration and wherein, upon addition of the volatile memory device, said data is re-striped across the volatile memory devices in a second RAID configuration.

9. The system of claim 7 comprising a plurality of field replaceable units (FRUs), each FRU comprises at least one of said volatile memory devices and an exclusive-OR engine, and each FRU is removable from said system independent from another FRU.

10. A system, comprising:
means for configuring three or more volatile memory devices according to a first redundant array of independent disk (RAID) configuration; and
means for re-configuring the remaining volatile memory devices according to a second RAID configuration upon cessation of correct operation at least one of said three or more volatile memory devices.

11. The system of claim 10 further comprising means for re-configuring said three or more volatile memory devices, including said newly added volatile memory device, according to the first RAID configuration upon adding a volatile memory device.

12. A method, comprising:
configuring a three or more volatile memory devices according to a first redundant array of independent disk (RAID) configuration; and
upon cessation of correct operation at least one of said three or more volatile memory devices, re-configuring the remaining volatile memory devices according to a second RAID configuration.

13. The method of claim 12 further comprising adding a volatile memory device and again re-configuring said three or more volatile memory devices, including said newly added volatile memory device according to the first RAID configuration.

14. The method of claim 12 wherein configuring said three or more volatile memory devices comprises striping data across said plurality of volatile memory devices.

15. The method of claim 12 wherein re-configuring the remaining volatile memory devices comprises re-striping data across said remaining volatile memory devices.

16. The method of claim 12 further comprising performing a read request while re-configuring the remaining volatile memory devices by computing an exclusive-OR operation on data associated with the requested read.

17. The method of claim 12 further comprising, while re-configuring the remaining volatile memory devices, performing a write request, containing write data, by computing an exclusive-OR operation with said write data and other data in said remaining volatile memory devices.

18. A method, comprising:
configuring a plurality of volatile memory devices according to a first redundant array of independent disk (RAID) configuration; and
upon addition of a volatile memory device, re-configuring the volatile memory devices, including the added volatile memory device according to a second RAID configuration.

19. The method of claim 18 wherein configuring the volatile memory devices comprises striping data across said volatile memory devices.

20. The method of claim 18 wherein re-configuring the volatile memory devices comprises re-striping data across the volatile memory devices, including the added volatile memory device.

* * * * *

UNITED STATES PATENT AND TRADEMARK OFFICE
CERTIFICATE OF CORRECTION

PATENT NO.         : 7,093,158 B2
APPLICATION NO.    : 10/095125
DATED              : August 15, 2006
INVENTOR(S)        : Dwight L. Barron et al.

Page 1 of 1

It is certified that error appears in the above-identified patent and that said Letters Patent is hereby corrected as shown below:

In column 6, line 57, delete "RALD" and insert -- RAID --, therefor.

In column 8, line 11, in Claim 12, after "configuring" delete "a".

In column 8, line 45, in Claim 18, after "device" insert -- , --.

Signed and Sealed this

Third Day of March, 2009

JOHN DOLL
*Acting Director of the United States Patent and Trademark Office*